(12) United States Patent
Miura et al.

(10) Patent No.: US 8,182,660 B2
(45) Date of Patent: May 22, 2012

(54) POWER SUPPLY APPARATUS AND DEPOSITION METHOD USING THE POWER SUPPLY APPARATUS

(75) Inventors: Yasushi Miura, Kawasaki (JP); Kazunari Sekiya, Fuchu (JP)

(73) Assignee: Canon Anelva Corporation, Tokyo (JP)

( * ) Notice: Subject to any disclaimer, the term of this patent is extended or adjusted under 35 U.S.C. 154(b) by 925 days.

(21) Appl. No.: 11/945,256

(22) Filed: Nov. 26, 2007

(65) Prior Publication Data

US 2008/0258411 A1  Oct. 23, 2008

(30) Foreign Application Priority Data

Nov. 30, 2006 (JP) ................................ 2006-322747
Oct. 23, 2007 (JP) ................................ 2007-275635

(51) Int. Cl.
*C25D 17/06* (2006.01)

(52) U.S. Cl. ......... 204/298.08; 204/298.07; 204/298.09; 204/298.15; 204/192.1; 204/192.12; 269/57; 156/345.1

(58) Field of Classification Search ............. 204/298.07, 204/298.08, 298.09, 298.15, 192.12, 192.1; 156/345.1; 269/57
See application file for complete search history.

(56) References Cited

U.S. PATENT DOCUMENTS

| 5,542,559 A | * | 8/1996 | Kawakami et al. | ............. 216/67 |
| 5,980,706 A | * | 11/1999 | Bleck et al. | ............. 204/297.14 |
| 6,106,676 A | * | 8/2000 | Terry et al. | ............. 204/192.13 |
| 6,395,095 B1 | * | 5/2002 | Jones et al. | ................... 118/728 |

FOREIGN PATENT DOCUMENTS

| EP | 0725427 | | 8/1996 |
| JP | 2002-339064 A | | 11/2002 |
| JP | 2003-243312 | | 8/2003 |
| JP | 2003243312 A | * | 8/2003 |

OTHER PUBLICATIONS

Machine Translation of JP2003-243312A by Honda. Published Aug. 2003.*
European Search Report dated May 6, 2010 issued during prosecution of related European Patent Application No. 07121902.6.

* cited by examiner

*Primary Examiner* — Keith Hendricks
*Assistant Examiner* — Jason M Berman
(74) *Attorney, Agent, or Firm* — Fitzpatrick, Cella, Harper & Scinto

(57) ABSTRACT

A power supply apparatus includes a power supply mechanism which supplies, from an external power supply, electric power to be supplied to an electrostatic chuck. The power supply mechanism includes a first conductive annular member fixed to the end portion of a strut, and capable of rotating together with the strut, a second conductive annular member fixed to a housing, and brought into surface contact with the first conductive annular member, and a first power supply member which supplies a supplied first voltage to an electrode of the electrostatic chuck via the second conductive annular member and the first conductive annular member.

7 Claims, 7 Drawing Sheets

POWER SUPPLY APPARATUS AND DEPOSITION METHOD USING THE POWER SUPPLY APPARATUS

BACKGROUND OF THE INVENTION

1. Field of the Invention

The present invention relates to a power supply technique and, more particularly, to a power supply apparatus suited to stably supply a voltage to the electrostatic chuck of a substrate holder rotatably installed in a vacuum processing chamber, and a deposition method using the power supply apparatus.

2. Description of the Related Art

In a vacuum processing apparatus such as a deposition apparatus that deposits various films and the like on a substrate, or a dry etching apparatus that etches films and the like deposited on a substrate, it is necessary to rotate a substrate and improve temperature control for controlling the temperature of the substrate at a desired temperature in order to increase the uniformity of processing on the substrate surface. The vacuum processing apparatus generally incorporates a heating device or cooling device for substrate temperature control in a substrate holder in many cases. To increase the substrate temperature control accuracy, it is important to increase the adhesion between a rotatable substrate holder and a substrate mounted on and fixed to the substrate holder, and accurately set the substrate at a desired temperature by supplying a gas between the substrate holder and substrate. Electrostatic attraction using an electrostatic chuck is effective as a means for fixing a substrate mounted on the substrate holder. However, attaching the electrostatic chuck to the substrate mounting surface of the rotating substrate holder requires a power supply mechanism capable of stably supplying electric power (a DC voltage and a bias voltage applied to a substrate in addition to the DC voltage, to be referred to as a DC voltage and the like hereinafter) for operating the electrostatic chuck.

In a vacuum processing apparatus having a substrate rotating mechanism, a rotating strut that supports a substrate holder installed in a vacuum chamber extends through the wall of the vacuum chamber, and is rotatably held such that a magnetic fluid seal secures airtightness between the rotating strut and the wall surface of the vacuum chamber. As the power supply mechanism that supplies the bias voltage to a substrate mounted on the substrate holder in the vacuum chamber, a conductive electrode member connected to the power supply is generally urged against the circumferential surface of the rotating strut by a point contact structure (e.g., Japanese Patent Laid-Open No. 2002-339064). High-frequency power supplied from the power supply is supplied in the order of the conductive electrode member having the point contact structure, the rotating strut, and the substrate holder, and finally applied to the substrate on the substrate holder.

Recently, to further improve the performance and increase the degree of integration of magnetoresistive effect elements such as a TMR (Tunneling MagnetoResistive) element and MRAM (Magnetic Random Access Memory) and other high-performance elements, demand has arisen to increase the uniformity of film quality such as the crystal grains and stress and the uniformity of film thickness, thereby further improving its characteristics. For this purpose, micropatterning processes such as deposition and dry etching performed with a substrate being rotated are essential process conditions. It is also necessary to more accurately control and supply DC voltage and the like to a substrate mounted on the rotating substrate holder.

Unfortunately, it is difficult for conventional power supply mechanisms to supply sufficiently high electric power because a point contact structure is used between the rotating strut of the substrate holder and the conductive electrode member. Also, in this structure, a carbon electrode of the conductive electrode member is brought into contact with the circumferential surface of the rotating strut in rotation. Therefore, increasing the contact area of the electrode limits the rotation of the rotating strut and makes the rotation unstable. In addition, deterioration caused by the wear heat of the carbon electrode makes power supply to a substrate and the like unstable. If power supply to a substrate becomes unstable, the bias voltage on the substrate surface becomes nonuniform, and this interferes with uniform and homogeneous deposition. This also poses the additional problems of charge-up occurring on the substrate surface which breaks element functions, and an inability to raise the etching rate.

SUMMARY OF THE INVENTION

The present invention has been made in consideration of the above situation, and has as its object to provide a power supply technique capable of stably supplying high electric power to a substrate on a substrate holder from outside a vacuum chamber with high control accuracy, and to also be capable of facilitating maintenance management.

To achieve the above object, a power supply apparatus and a deposition method using the power supply apparatus according to the present invention have the following arrangements.

According to one aspect of the present invention, there is provided a power supply apparatus comprising:

a substrate holder having an electrostatic chuck which generates an attracting force for holding a substrate;

a strut which rotatably supports the substrate holder;

a rotational driving mechanism which rotates the substrate holder via the strut;

a housing which supports the strut; and a power supply mechanism which supplies, from an external power supply, electric power to be supplied to the electrostatic chuck, wherein the power supply mechanism includes a first conductive annular member fixed to an end portion of the strut, and adapted to rotate together with the strut, a second conductive annular member fixed to the housing, and brought into surface contact with the first conductive annular member, and a first power supply member which supplies a supplied first voltage to an electrode of the electrostatic chuck via the second conductive annular member and the first conductive annular member.

According to another aspect of the present invention, there is provided a deposition method of performing deposition on a substrate, comprising the steps of:

placing, on a stage, a substrate transferred into a vacuum chamber;

supplying a voltage to an electrode of an electrostatic chuck from an external power supply by using a power supply apparatus cited in claim 1, and fixing the substrate placed on the stage by an attracting force generated by the electrostatic chuck;

rotating the substrate holder;

supplying a gas into the vacuum chamber at a predetermined flow rate; and depositing a material sputtered from a target onto the substrate by performing discharge to the gas.

The present invention makes it possible to stably supply high electric power to a substrate on a substrate holder from outside a vacuum chamber with high control accuracy, while facilitating maintenance management.

Alternatively, in a power supply apparatus having a rotatable substrate holder including an electrostatic chuck having a single-pole or positive-negative dipole electrode structure, a rotary joint is formed between the bottom surface of a rotating strut of the substrate holder and a base that supports the load of the rotating strut and the like. This rotary joint includes a plurality of concentrically arranged conductive annular members having surface-contact sliding surfaces on the same plane around the central axis of the rotating strut. Accordingly, it is possible to stably supply electric power to, for example, the electrode of the electrostatic chuck without making the rotation of the substrate holder unstable.

It is also possible to easily enlarge the surface-contact sliding surfaces of the rotary joint for power supply. Consequently, a high bias voltage (electric power) and the like can be stably supplied to a substrate on the substrate holder from outside a vacuum chamber.

Furthermore, maintenance time can be shortened because the conductive annular members of the rotary joint are integrally arranged as a unit.

Further features of the present invention will become apparent from the following description of exemplary embodiments with reference to the attached drawings.

DESCRIPTION OF THE EMBODIMENTS

Preferred embodiments of the present invention will be explained in detail below with reference to the accompanying drawings. However, constituent elements described in the embodiments are merely examples, so the scope of the invention is not limited to these constituent elements.

First Embodiment

Figure 1:
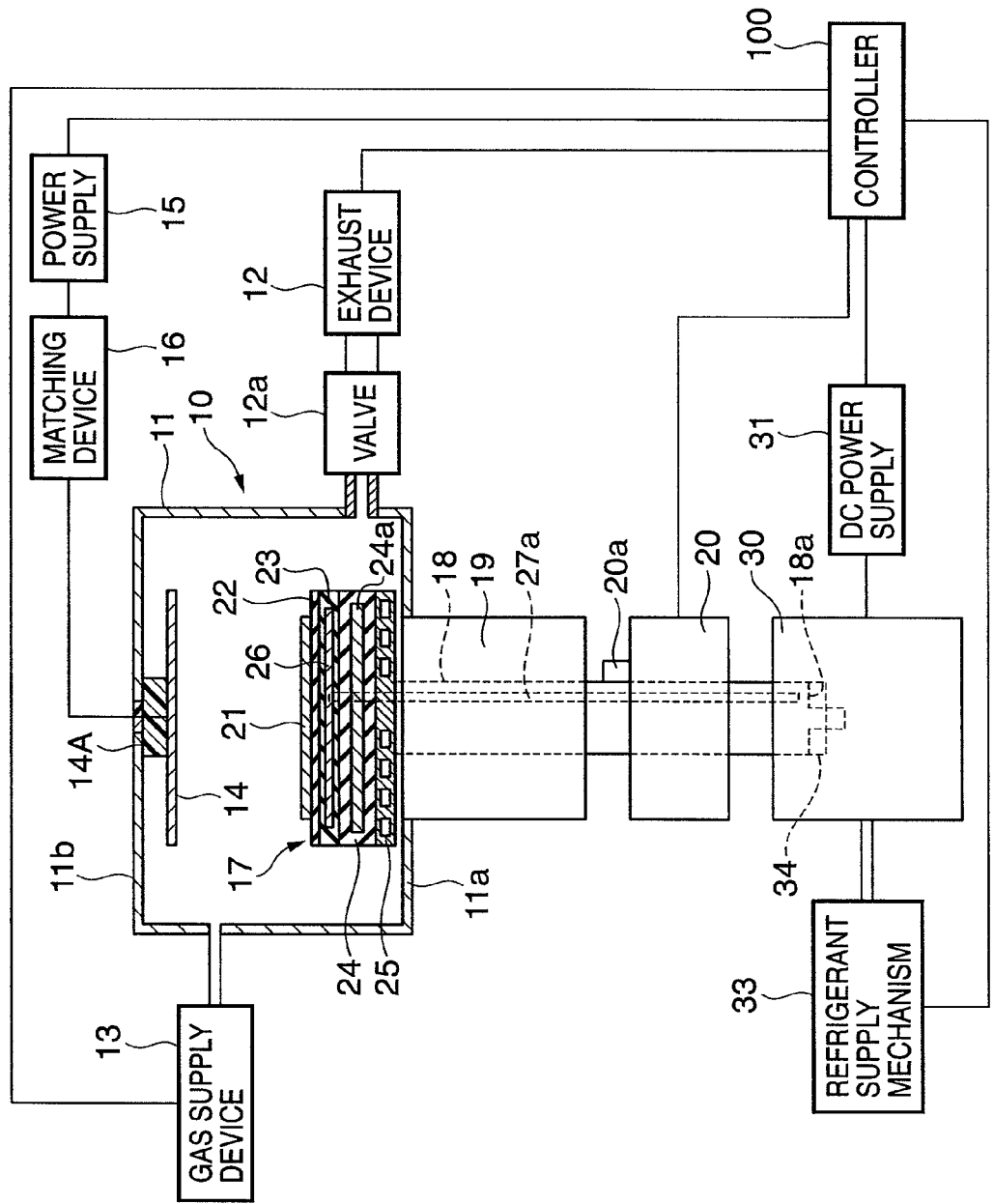
FIG. 1 is a longitudinal sectional view showing the overall arrangement of the power supply apparatus according to the first embodiment of the present invention.
Figure 2A:
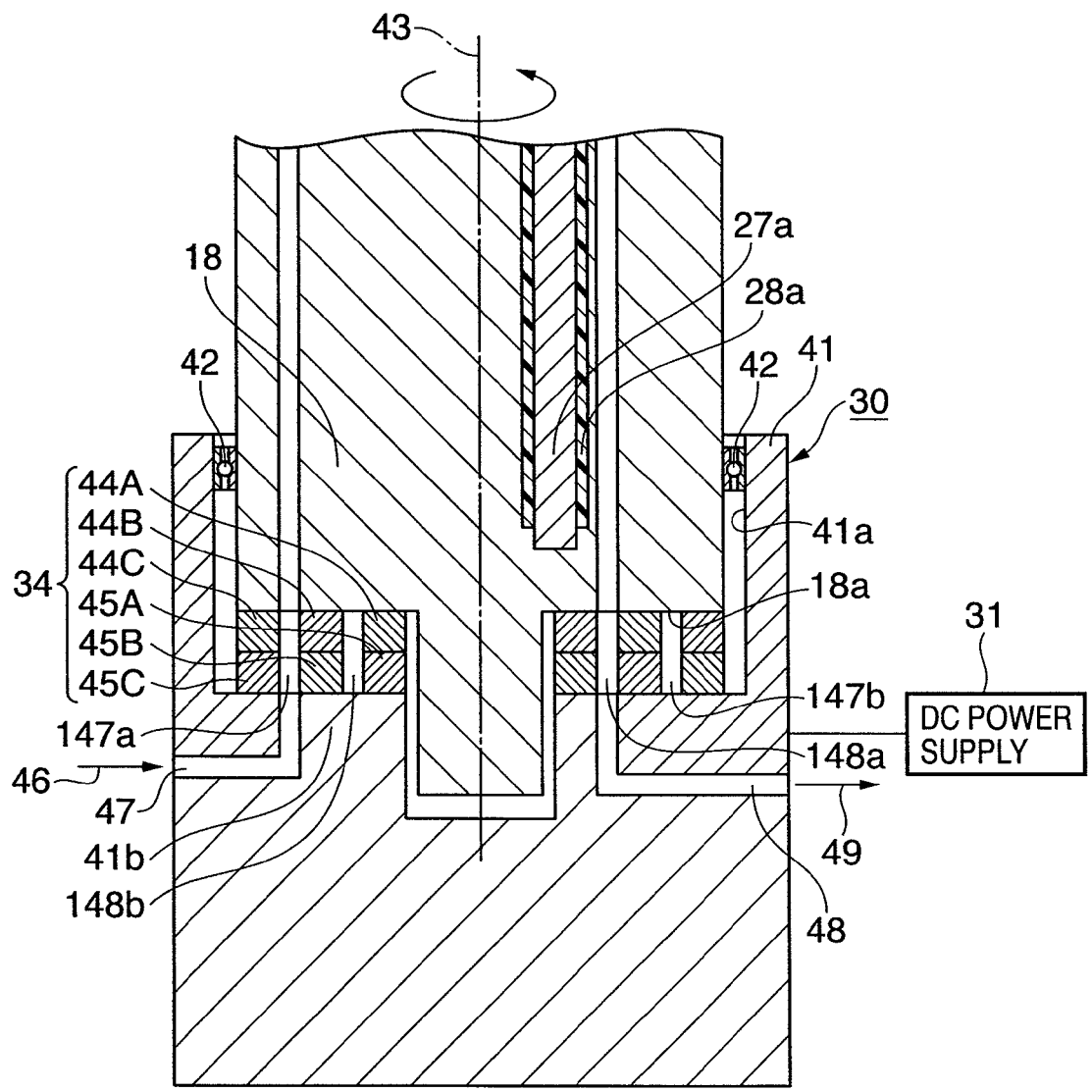
FIG. 2A is a view for explaining the internal structure of a power supply mechanism according to the first embodiment.

The first embodiment of a power supply apparatus according to the present invention will be explained below with reference to FIGS. 1 and 2A to 2C. FIG. 1 is a longitudinal sectional view showing the overall arrangement of the power supply apparatus. FIG. 2A is an enlarged longitudinal sectional view of a power supply mechanism.

This power supply apparatus includes, for example, a sputtering deposition apparatus. However, the spirit and scope of the present invention are not limited to this example, and naturally applicable to another vacuum processing apparatus.

(Arrangement of Power Supply Apparatus)

Referring to FIG. 1, a power supply apparatus 10 comprises a vacuum chamber 11, an exhaust device 12 that sets the interior of the vacuum chamber 11 in a predetermined pressure-reduced state, a gas supply device 13 that supplies a gas to be used in plasma generation, a target 14, and a power supply 15 (e.g., a DC power supply) that supplies electric power to the target 14. A material corresponding to a substance to be deposited is used as the target 14. A valve 12a is installed before the exhaust device 12. The target 14 and power supply 15 are connected via, for example, a matching device 16.

In the vacuum chamber 11, a substrate holder 17 is installed above a bottom 11a of the vacuum chamber 11. A rotatable strut (to be referred to as "a rotating strut" hereinafter) 18 is connected to the bottom surface of the substrate holder 17. The rotating strut 18 is rotatably attached to a hole formed in the bottom 11a of the vacuum chamber 11 via a vacuum sealing mechanism 19 such as a magnetic fluid seal. This maintains airtightness in the vacuum chamber 11. Also, the substrate holder 17 fixed to the rotating strut 18 can rotate a substrate 21 mounted on the substrate holder 17 by a rotating mechanism (a rotational driving mechanism 20 to be described later).

The target 14 is fixed to a ceiling 11b of the vacuum chamber 11 by a fixing member 14A having insulating properties. The vacuum chamber 11 itself is made of a conductive member, and generally held at the ground potential as it is grounded.

The rotational driving mechanism 20 is installed below the vacuum sealing mechanism 19. The rotational driving mechanism 20 functions as a motor that rotates the rotating strut 18 by the interaction between a magnet (not shown) attached to the rotating strut 18, and an electromagnet (not shown) positioned around the outer circumferential surface of the magnet. The rotational driving mechanism 20 has an encoder 20a that detects the rotational speed and rotational direction of the rotating strut 18.

The substrate holder 17 comprises a dielectric plate 22 as a stage (mounting surface) on which a substrate 21 is placed, and an electrostatic chuck (electrostatic attracting device) 23 for fixing the mounted substrate 21 by urging it against the dielectric plate 22 with an appropriate electrostatic attracting force. The substrate holder 17 also comprises a heating mechanism 24 having a heating member 24a and a cooling mechanism 25 that cools the substrate holder 17 by the circulation of a refrigerant, as a temperature control mechanism for controlling the whole of the substrate holder 17 at a temperature required for deposition. When electric power is supplied to the heating mechanism 24, the heating member 24a is heated, and heating temperature control for holding the whole of the substrate holder 17 at a temperature necessary for deposition is executed. The cooling mechanism 25 will be explained in detail later together with the supply of the refrigerant.

The electrostatic chuck 23 is a single-pole chucking device, and incorporates an electrode 26. The electrode 26 is embedded in a plate-like insulator. A predetermined DC voltage is supplied (applied) to the electrode 26 via a power supply member (to be referred to as "a power supply rod" hereinafter) 27a formed inside the substrate holder 17 and rotating strut 18. The power supply rod 27a extends to the lower end of the rotating strut 18 as shown in FIG. 1, and is covered with an insulating member 28a as shown in FIG. 2A.

A power supply mechanism 30 for applying a bias voltage to the electrode 26 of the electrostatic chuck 23 is installed in the lower end portion of the rotating strut 18. The power supply mechanism 30 is connected to a DC power supply 31 and refrigerant supply mechanism 33. Inside the power supply mechanism 30, a rotary joint 34 is formed below a bottom surface 18a of the rotating strut 18.

A controller 100 can comprehensively control the operations of the constituent elements such as the exhaust device 12, gas supply device 13, power supply 15, rotational driving mechanism 20, refrigerant supply mechanism 33, and DC power supply 31 of the power supply apparatus.

The power supply apparatus includes a sensor (not shown) for sensing the temperature of the substrate holder 17. The controller 100 can adjust the substrate holder 17 to a temperature suitable for deposition by controlling the heating mechanism 24 and refrigerant supply mechanism 33 on the basis of the result of sensing by the sensor.

(Deposition Method Using Power Supply Apparatus)

A sputtering deposition method using the power supply apparatus 10 will be explained below with reference to FIG. 1. This processing is executed under the comprehensive control of the controller 100. In the first step (S1), a transfer robot (not shown) transfers the substrate 21, and loads it into the vacuum chamber 11 through a valve (not shown). The substrate 21 loaded into the vacuum chamber 11 is held in a holding position on the mounting surface of the stage 22 of the substrate holder 17.

When receiving a signal indicating the completion of the transfer from the transfer robot, the power supply apparatus supplies the bias voltage from the DC power supply 31 to the electrode 26 of the electrostatic chuck 23 via the power supply mechanism 30 in the second step (S2). Consequently, a plasma is generated, and the substrate holder 17 holds (fixes) the substrate 21 by the electrostatic attracting force of the electrostatic chuck 23.

After the substrate 21 is fixed to the substrate holder 17, the process advances to the third step (S3), and the rotational driving mechanism 20 starts driving and rotates the substrate 21 together with the rotating strut 18.

If it is confirmed by a pressure sensor (not shown) that the exhaust device 12 has exhausted the vacuum chamber 11 to a predetermined pressure, the process advances to the fourth step (S4), and the gas supply device 13 operates to supply a predetermined gas into the vacuum chamber 11 at a predetermined flow rate.

In the fifth step (S5), the power supply 15 operates to sputter the target 14 by sputtering discharge, thereby generating a plasma. When a thin film formed on the surface of the substrate 21 has reached a predetermined thickness by the continuation of sputtering, the power supply 15 stops operating.

(Structure of Power Supply Mechanism 30)

The internal structure of the power supply mechanism 30 will be explained in detail below with reference to FIG. 2A. FIG. 2A shows details of the structure of the rotary joint 34 as a main component of the power supply mechanism 30. Referring to FIG. 2A, the upper portion of the power supply apparatus is cut away from an appropriate position. Reference numeral 18 denotes the rotating strut described above, and only its lower end portion is shown. Reference numeral 41 denotes a housing for supporting the rotating strut 18 in the power supply mechanism 30. The housing 41 is made of a conductive member.

The housing 41 has a plug 41a into which the lower end portion of the rotating strut 18 is inserted, and a base 41b forming the bottom of the plug 41a. The sectional shape of the plug 41a of the housing 41 is a circle. The sectional shape of the rotating strut 18 is also a circle. A bearing 42 having sealing properties and insulating properties is formed between the outer circumferential surface of the lower end portion of the rotating strut 18 inserted into the plug 41a of the housing 41 and the inner circumferential surface of the plug 41a. The bearing 42 supports the rotation of the rotating strut 18 that rotates around a central axis 43.

The bottom surface 18a of the rotating strut 18 and the base 41b forming the bottom of the plug 41a oppose each other. The rotary joint 34 described above is formed in the space between the bottom surface 18a of the rotating strut 18 and the base 41b.

The rotating strut 18 rotates around the central axis 43. The power supply rod 27a is placed inside the rotating strut 18 in its axial direction. The power supply rod 27a is covered with the insulating member 28a, and has a lower end portion electrically connected to the lower end portion of the rotating strut 18 made of the conductive member.

The rotary joint 34 comprises, for example, three conductive annular members 44A, 44B, and 44C fixed to the bottom surface 18a of the rotating strut 18 and concentrically arranged around the central axis 43, and, for example, three conductive annular members 45A, 45B, and 45C fixed to the base 41b of the housing 41 and concentrically arranged around the central axis 43. The three conductive annular members 44A, 44B, and 44C on the rotating side and the three conductive annular members 45A, 45B, and 45C on the fixed side respectively have the same diameters, and are arranged in surface contact with one another in annular regions. When the rotating strut 18 rotates, the conductive annular members 44A, 44B, and 44C and conductive annular members 45A, 45B, and 45C respectively have surface-contact sliding relationships.

Figure 2B:
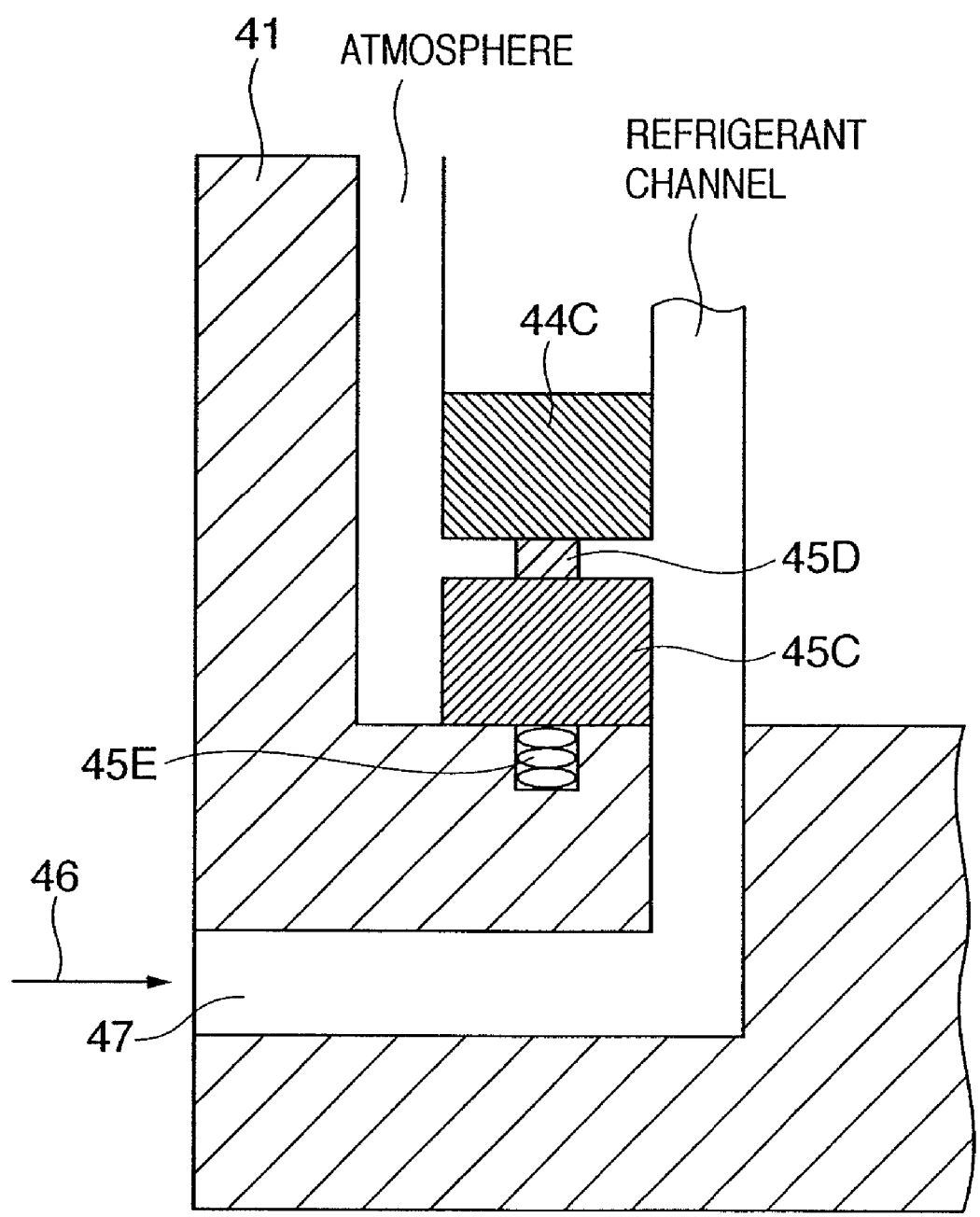
FIG. 2B is a view for explaining the relationship between a conductive annular member 44C on the rotating side and a conductive annular member 45C on the fixed side as an example.

FIG. 2B is an exemplary view for explaining the surface-contact sliding relationship between the conductive annular member 44C on the rotating side and the conductive annular member 45C on the fixed side. A projection 45D having a sectional area smaller than that of the conductive annular members 44C and 45C is formed on the conductive annular member 45C on the fixed side, and comes in contact with the conductive annular member 44C on the rotating side. The lubricating properties between the projection 45D and conductive annular member 44C can be improved by dipping the contact surface between them into pure water as a refrigerant.

Furthermore, when compared to the case that the conductive annular members 44C and 45C come in direct contact with each other, the sliding resistance generated by the contact between the conductive annular member 44C and projection 45D can be reduced because the contact sectional area is decreased.

Also, an elastic member 45E such as a coil spring, leaf spring, or rubber biases the conductive annular member 45C. The projection 45D and conductive annular member 44C come in tight contact with each other via the biased conductive annular member 45C. This makes it possible to prevent leakage of the pure water supplied as the refrigerant to the atmosphere. This similarly applies to the conductive annular members 44A, 44B, 45A, and 45B.

The bearing 42 described above can also receive the load in the direction of gravity from the rotating strut 18. This reduces the load applied in the direction of gravity from the rotating strut 18 to the rotary joint 34. Since the load received by the rotary joint 34 is reduced, the sliding resistances between the projection 45D and the like formed on the conductive annular member 45C and the like on the fixed side and the conductive annular members 44A, 44B, and 44C on the rotating side decrease in the rotary joint 34, thereby achieving smooth rotation of the rotating strut 18.

Enlarging the sliding surface in the rotary joint makes it possible to stably supply a high bias voltage (electric power) and the like from outside the vacuum chamber.

The DC power supply 31 is connected to the base 41b of the housing 41. This forms an electrical connecting portion (the rotary joint 34) that supplies electric power from the conductive annular members 45A, 45B, and 45C on the fixed side to the conductive annular members 44A, 44B, and 44C on the rotating side. Accordingly, the DC voltage supplied from the DC power supply 31 can be applied to the electrode 26 via the base 41b of the housing 41, the conductive annular members 45A, 45B, and 45C, the conductive annular members 44A, 44B, and 44C, and the power supply rod 27a in the rotating strut 18.

The refrigerant supply mechanism 33 supplies a refrigerant to a channel 47 in the base 41b as indicated by an arrow 46. The supplied refrigerant flows into a channel 147a formed in the rotary joint 34. Then, the supplied refrigerant flows into a channel 147b in the circumferential direction, which communicates with the channel 147a.

Also, a refrigerant discharged from the cooling mechanism 25 (to be explained later) flows into a channel 148a formed in the rotary joint 34. The refrigerant then flows into a channel 148b in the circumferential direction, which communicates with the channel 148a. The refrigerant flowing through the channels 147a, 147b, 148a, and 148b removes the heat generated by the rotary joint 34, thereby cooling it. A favorable example of the refrigerant used is pure water. When pure water is used as the refrigerant, the resistance value can be increased by increasing the purity, and this advantageously prevents an easy flow of electricity.

Tungsten carbide that does not easily rust is an example of the material used as the conductive annular members 44A, 44B, and 44C on the rotating side and the conductive annular members 45A, 45B, and 45C on the fixed side. The use of tungsten carbide can prevent a portion in contact with pure water as the refrigerant from rusting.

The refrigerant supplied from the refrigerant supply mechanism 33 further flows into the cooling mechanism 25 through the channel 47. The channel 47 can supply the refrigerant to the cooling mechanism 25 through the housing 41, the conductive annular members on the fixed side, the conductive annular members on the rotating side, and the rotating strut 18.

Figure 2C:
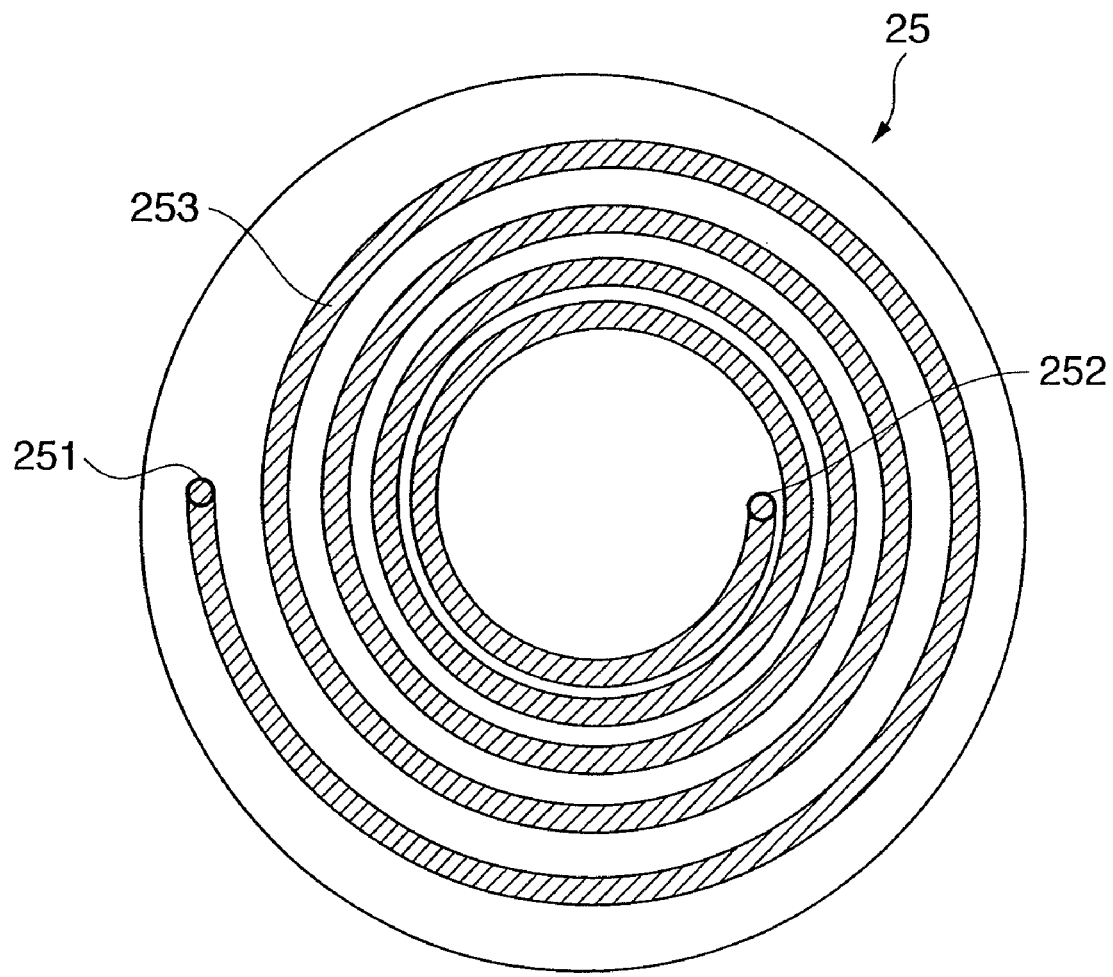
FIG. 2C is a view for explaining the structure of a cooling mechanism according to the first embodiment.

FIG. 2C is a sectional view for explaining the channel structure formed in the cooling mechanism 25. Reference numeral 251 denotes a refrigerant support port; and 252, a refrigerant discharge port. The supply port 251 communicates with the channel 47 for supplying the refrigerant, and the refrigerant is supplied from the supply port 251 to the cooling mechanism 25. Reference numeral 253 denotes a continuous channel formed in the cooling mechanism 25. A refrigerant flowing through the channel 253 cools the substrate holder 17. The refrigerant supplied from the support port 251 to the cooling mechanism 25 flows through the channel 253 and reaches the discharge port 252. The discharge port 252 communicates with a channel 48 for discharging the refrigerant. The channel 48 can discharge the refrigerant from the cooling mechanism 25 through the rotating strut 18, the conductive annular members on the rotating side, the conductive annular members on the fixed side, and the housing 41.

In the structure of the rotary joint 34, the number of the conductive annular members 44A to 44C and conductive annular members 45A to 45C is preferably an arbitrary number of 2 or more, and more preferably, at least 2. In this case, a channel through which the refrigerant supplied from the refrigerant supply mechanism 33 flows can be formed between the two conductive annular members.

Second Embodiment

The second embodiment of the power supply apparatus according to the present invention will be explained below with reference to FIGS. 3, 4, and 5.

Figure 3:
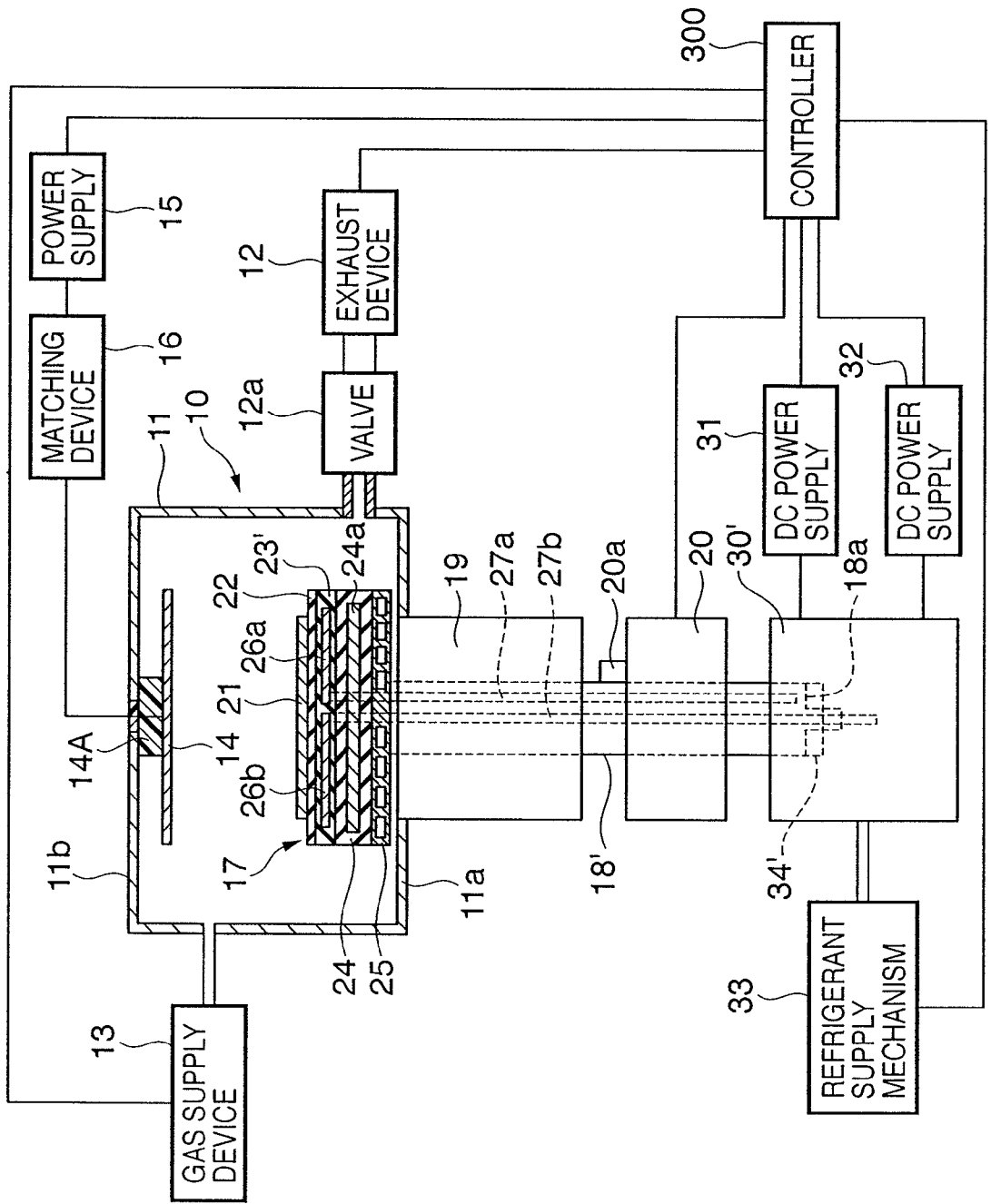
FIG. 3 is a longitudinal sectional view showing the overall arrangement of a power supply apparatus according to the second embodiment of the present invention.

FIG. 3 is a longitudinal sectional view showing the overall arrangement of the power supply apparatus. FIG. 4 is an enlarged longitudinal sectional view of a power supply mechanism 30'. FIG. 5 is a sectional view taken along a line A-A in FIG. 4. In FIGS. 3 and 4, the same reference numerals as in the first embodiment denote the same elements as explained in the first embodiment.

An electrostatic chuck 23' is a positive-negative dipole chucking device, and incorporates two electrodes 26a and 26b. The electrodes 26a and 26b are embedded in a plate-like insulator.

A predetermined first DC voltage is supplied (applied) to the electrode 26a (a first electrode) via a power supply rod 27a formed inside a substrate holder 17 and rotating strut 18'. A predetermined second DC voltage is supplied (applied) to the electrode 26b (a second electrode) via a power supply rod 27b formed near, for example, the axis of the substrate holder 17 and rotating strut 18'. The two power supply rods 27a and 27b extend to the lower end of the rotating strut 18' as shown in FIG. 3, and are respectively covered with insulating members 28a and 28b.

A power supply mechanism 30' for applying two different bias voltages to the two electrodes 26a and 26b of the electrostatic chuck 23' is installed in the lower end portion of the rotating strut 18' (FIG. 3). The power supply mechanism 30' is connected to two DC power supplies 31 and 32 and a refrigerant supply mechanism 33. Inside the power supply mechanism 30', a rotary joint 34' is formed below a bottom surface 18a of the rotating strut 18' (FIG. 3). The rotary joint 34' comprises rotary joints 34A and 34B (FIG. 4). Also, a slip ring (not shown) holds the lowermost end of the power supply rod 27b.

Figure 4:
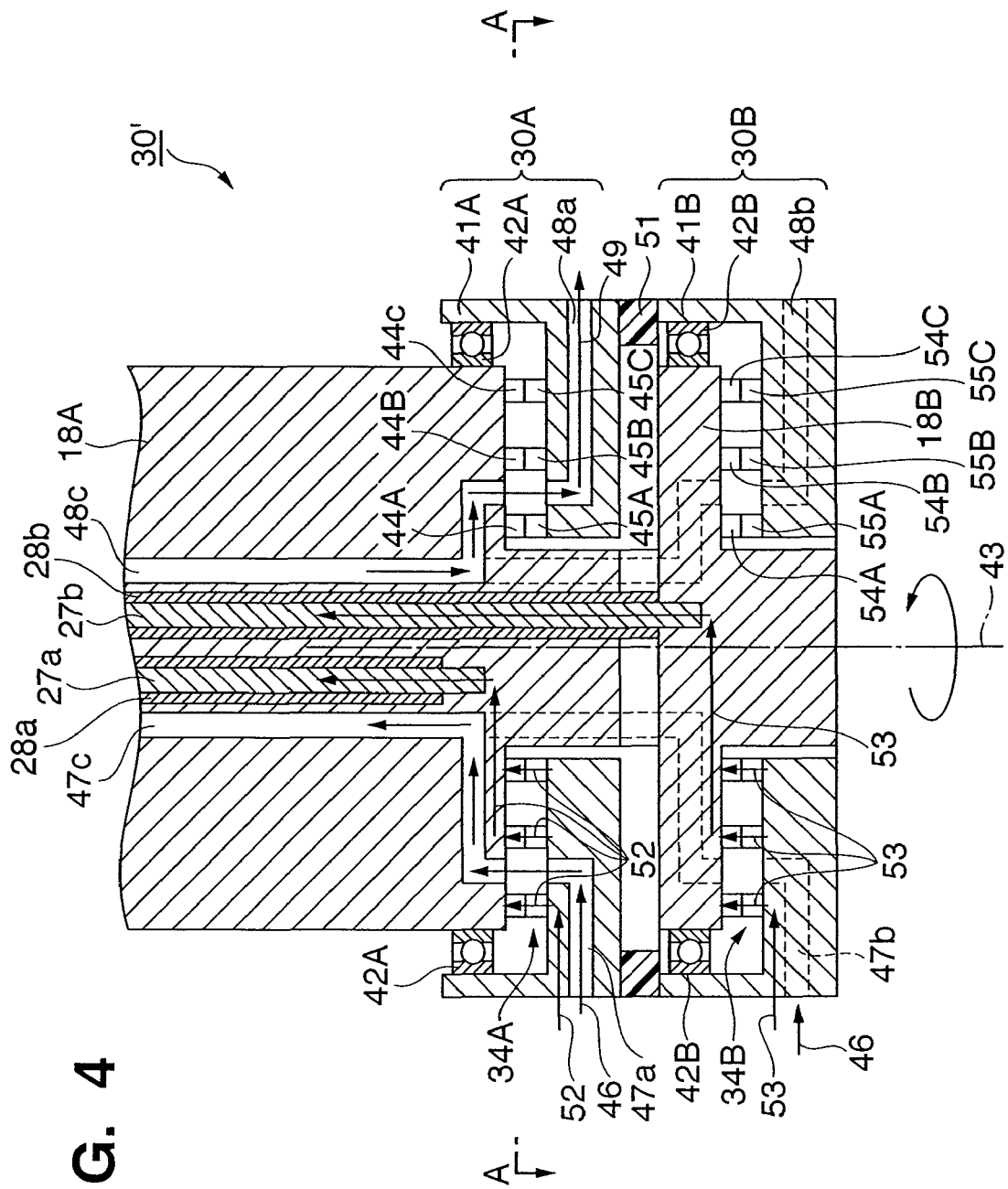
FIG. 4 is an enlarged longitudinal sectional view of the power supply apparatus according to the second embodiment.
Figure 5:
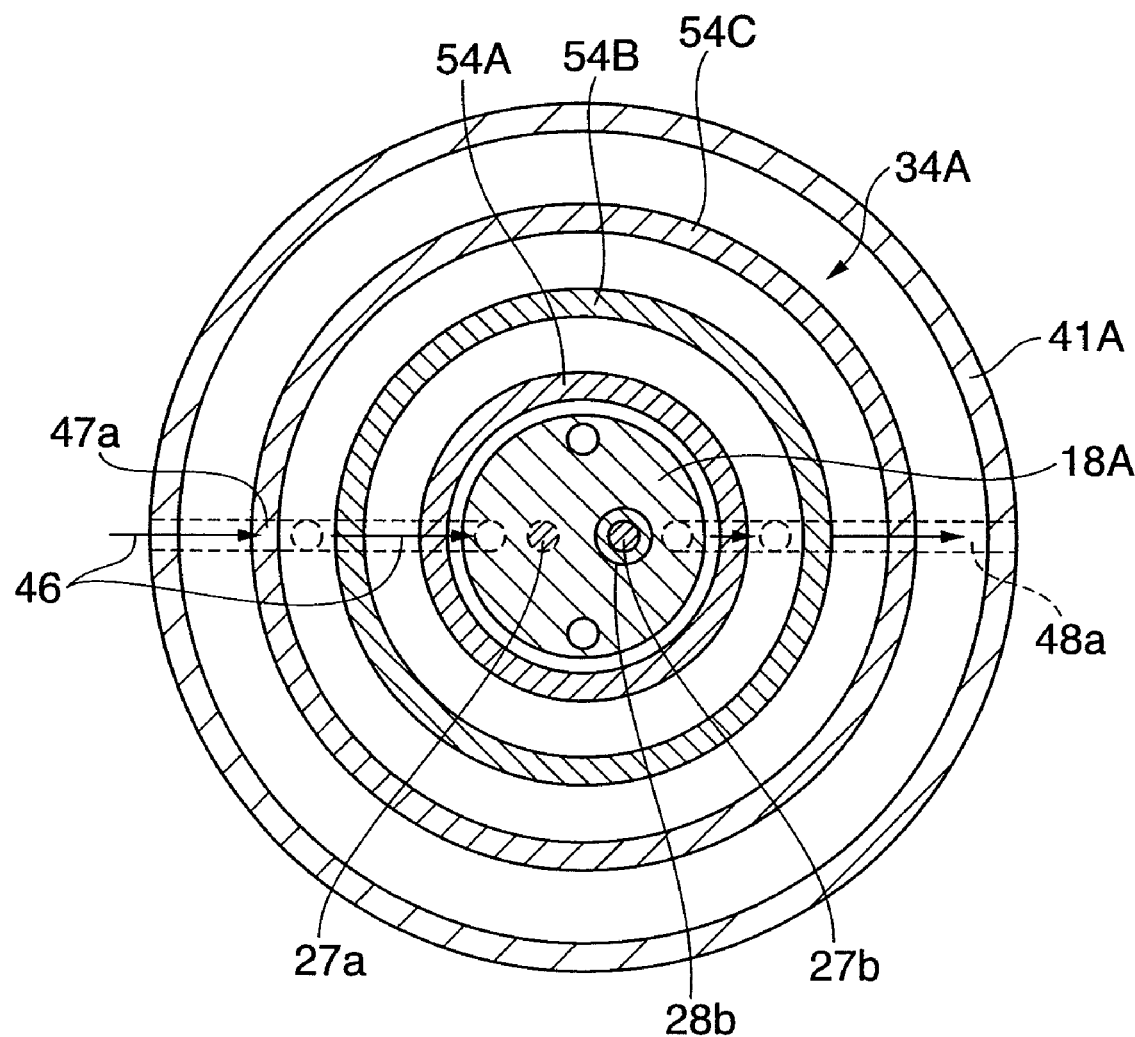
FIG. 5 is a sectional view taken along a line A-A in FIG. 4.

In this embodiment, the rotating strut 18' comprises rotating struts 18A and 18B (FIG. 4). The two rotating struts 18A and 18B are integrated and form the rotating strut 18' as a whole. The two rotating struts 18A and 18B can rotate around a central axis 43. The upper rotating strut 18A is a portion corresponding to the power supply rod 27a, and electrically connected to the power supply rod 27a. The lower rotating strut 18B is a portion corresponding to the power supply rod 27b, and electrically connected to the power supply rod 27b. In this embodiment, the power supply rod 27b is offset from the central axis 43. Note that a channel for supplying a refrigerant to a cooling mechanism 25 and a channel for discharging the refrigerant from the cooling mechanism 25 are formed inside the rotating strut 18' as in the first embodiment in addition to the power supply rods 27a and 27b.

In the arrangement of the second embodiment, the power supply mechanism 30A corresponds to the rotating strut 18A, and the power supply mechanism 30B corresponds to the lower rotating strut 18B. Each of the two power supply mechanisms 30A and 30B is equivalent to the power supply mechanism 30 explained in the first embodiment, and has practically the same structure as that of the power supply mechanism 30. The power supply mechanism 30A comprises a housing 41A, the rotary joint 34A, a bearing 42A having sealing properties and insulating properties, and a channel 47a for supplying a refrigerant 46. The power supply mechanism 30B comprises a housing 41B, the rotary joint 34B, a bearing 42B having sealing properties and insulating properties, and a channel 47b for supplying the refrigerant 46. The refrigerant supplied from the refrigerant supply mechanism 33 to the channels 47a and 47b flows into a channel 47c and is supplied to the cooling mechanism 25. The circulation of the refrigerant in the cooling mechanism 25 is the same as in the first embodiment. The refrigerant discharged from the cooling mechanism 25 is discharged outside the apparatus from a channel 48c through discharge channels 48a and 48b.

The rotary joints 34A and 34B each have practically the same structure as that of the rotary joint 34 explained in the first embodiment.

The housing 41A of the power supply mechanism 30A is connected to the DC power supply 31, and the housing 41B of the power supply mechanism 30B is connected to the DC power supply 32. Also, an annular member 51 having insulating properties is placed between the housing 41A of the power supply mechanism 30A and the housing 41B of the power supply mechanism 30B.

FIG. 4 mainly shows the arrangement of conductive annular members 44A, 44B, and 44C (first conductive annular members) on the rotating side of the rotary joint 34A, the arrangement of conductive annular members 45A, 45B, and 45C (second conductive annular members) on the fixed side of the rotary joint 34A, the flow (an arrow 46) of the refrigerant in the channels 47a and 47c, the flow (an arrow 49) of the refrigerant in the channels 48c and 48a, and the sectional structure of a central portion of the rotating strut 18A. The surface-contact sliding relationships between the conductive annular members 44A, 44B, and 44C on the rotating side and the conductive annular members 45A, 45B, and 45C on the fixed side are the same as those of the arrangement explained with reference to FIG. 2B.

In the end portion of the rotating strut 18B, conductive annular members 54A, 54B, and 54C (third conductive annular members) concentric with the conductive annular members 44A, 44B, and 44C are arranged. The conductive annular members 54A, 54B, and 54C function as conductive annular members on the rotating side.

Also, in the base of the housing 42B, conductive annular members 55A, 55B, and 55C (fourth conductive annular members) concentric with the conductive annular members 45A, 45B, and 45C are arranged. The conductive annular members 55A, 55B, and 55C function as conductive annular members on the fixed side.

In the structure of the second embodiment, the power supply mechanism 30A supplies (applies) the DC voltage from the DC power supply 31 to the power supply rod 27a via the rotary joint 34A as indicated by an arrow 52. Also, the power supply mechanism 30B supplies (applies) the DC voltage from the DC power supply 32 to the power supply rod 27b via the rotary joint 34B as indicated by an arrow 53. This makes it possible to apply the DC voltage from the DC power supply 31 to the electrode 26a via the base of the housing 41A, the conductive annular members 55A, 55B, and 55C on the fixed side, the conductive annular members 54A, 54B, and 54C on the rotating side, and the power supply rod 27a.

It is also possible to apply the DC voltage from the DC power supply 32 to the electrode 26b via the base of the housing 41B, the conductive annular members 55A, 55B, and 55C on the fixed side, the conductive annular members 54A, 54B, and 54C on the rotating side, and the power supply rod 27b.

When holding a substrate on a rotating substrate holder by using an electrostatic chuck, two types of voltages different in polarity must be stably supplied from outside a vacuum chamber in order to perform electrostatic attraction without any plasma. Accordingly, the power supply apparatus according to this embodiment uses the dipole structure capable of applying positive and negative DC voltages to the electrodes 26a and 26b so as to allow electrostatic attraction of a substrate without any plasma.

In the arrangement shown in FIG. 3, a controller 300 can comprehensively control the operations of constituent elements such as an exhaust device 12, a gas supply device 13, a power supply 15, a rotational driving mechanism 20, and the refrigerant supply mechanism 33 of the power supply apparatus. The controller 300 can also control the outputs of the DC power supplies 31 and 32 in accordance with the generated state of a plasma. When the power supply 15 is a DC power supply, an internal ammeter (not shown) of the power supply 15 senses an electric current. This allows the controller 300 to detect the generation of a plasma inside a vacuum chamber 11. Note that the generation of a plasma may also be detected by using the result of sensing by a photosensor (not shown) installed inside the vacuum chamber 11, instead of the sensing of an electric current by the internal ammeter of the power supply 15. On the basis of the plasma generation detection result, the controller 300 can control the output voltages from the DC power supplies 31 and 32 so as to change the state in which DC voltages having different polarities are applied to the state in which DC voltages having the same polarity are applied. The thickness of a film formed on a substrate 21 can be made uniform by applying DC voltages having the same polarity to the electrodes 26a and 26b.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-322747 filed Nov. 30, 2006, and 2007-275635 filed Oct. 23, 2007 which are hereby incorporated by reference herein in their entirety.

What is claimed is:

1. A power supply apparatus comprising:
a substrate holder having an electrostatic chuck which generates an attracting force for holding a substrate, wherein a first electrode is arranged inside said electrostatic chuck and generates the attracting force;
a strut which rotatably supports said substrate holder and is rotatable around a central axis;
a rotational driving mechanism which rotates said substrate holder via said strut;
a first housing configured to support said strut, wherein first electric power from a first external power supply connected to said first housing is supplied to the first electrode of said electrostatic chuck via said first housing;
a first conductive annular member which is arranged around the central axis and is fixed to an end portion of said strut, and which is configured to rotate together with said strut;
a second conductive annular member which is arranged around the central axis and is fixed to said first housing, and which is brought into direct surface contact with said first conductive annular member, wherein an upper surface of said second conductive annular member and a lower surface of said first conductive annular member have a surface contact sliding relationship;
a third conductive annular member which is arranged around the central axis and is fixed to said strut, and which is configured to rotate together with said strut, wherein a first gap is formed between an inner circumferential surface of said first conductive annular member and an outer circumferential surface of said third conductive annular member;

a fourth conductive annular member which is arranged around the central axis and is fixed to said first housing, wherein a second gap is formed between an inner circumferential surface of said second conductive annular member and an outer circumferential surface of said fourth conductive annular member, and an upper surface of said fourth conductive annular member and a lower surface of said third conductive annular member have a surface contact sliding relationship;

a first power supply member which is arranged inside said strut and which supplies the first electric power to said first electrode of said electrostatic chuck via said first and second conductive annular members, and said third and fourth conductive annular members, wherein said first housing has a first channel which is formed to supply fluid into the first and second gaps.

2. The apparatus according to claim 1, further comprising:
a second electrode which is arranged inside said electrostatic chuck;
a fifth conductive annular member which is arranged around the central axis and is fixed to said strut, and which is configured to rotate together with said strut;
a second housing which is configured to support said strut, wherein second electric power from a second external power supply connected to said second housing is supplied to said second electrode of said electrostatic chuck via said second housing;
a sixth conductive annular member which is arranged around the central axis and is fixed to said second housing, and which is brought into direct surface contact with said fifth conductive annular member, wherein an upper surface of said sixth conductive annular member and a lower surface of said fifth conductive annular member have a surface contact sliding relationship;
a second power supply member which is arranged inside said strut and is arranged inside said first and second conductive annular members, and which supplies the second electric power to said second electrode of said electrostatic chuck via said fifth and sixth conductive annular members.

3. The apparatus according to claim 2, further comprising:
a seventh conductive annular member which is arranged around the central axis and is fixed to said strut, and which is configured to rotate together with said strut, wherein a third gap is formed between an inner circumferential surface of said fifth conductive annular member and an outer circumferential surface of said seventh conductive annular member;

an eighth conductive annular member which is arranged around the central axis and is fixed to said second housing, wherein a fourth gap is formed between an inner circumferential surface of said sixth conductive annular member and an outer circumferential surface of said eighth conductive annular member, and an upper surface of said eighth conductive annular member and a lower surface of said seventh conductive annular member have a surface of sliding relationship, wherein said housing has a second channel which is formed to supply fluid into the third and fourth gaps.

4. The apparatus according to claim 1, wherein
a projection is formed on a upper surface of said second conductive annular member, and wherein said projection has a sectional area smaller than a surface contact sliding area between said first and second conductive annular members.

5. The apparatus according to claim 4, further comprising:
an elastic member configured to bias the second conductive annular member and said projection to said first conductive annular member.

6. A deposition method of performing deposition on a substrate, comprising the steps of:
placing, on a stage, a substrate transferred into a vacuum chamber;
supplying a voltage to an electrode of an electrostatic chuck from an external power supply by using the power supply apparatus of claim 1, and fixing the substrate placed on the stage by an attracting force generated by the electrostatic chuck;
rotating the substrate holder;
supplying a gas into the vacuum chamber at a predetermined flow rate; and
depositing a material sputtered from a target onto the substrate by performing discharge to the gas.

7. A vacuum processing apparatus comprising:
the power supply apparatus of claim 1, arranged in a vacuum chamber including an exhaust device;
a gas supply device constructed to introduce, into the vacuum chamber, gas used for generating plasma; and
a fixing unit constructed to fix a target in the vacuum chamber.

* * * * *